United States Patent [19]
Takahashi

[11] Patent Number: 5,896,035
[45] Date of Patent: Apr. 20, 1999

[54] ELECTRIC FIELD MEASURING APPARATUS

[75] Inventor: Hironori Takahashi, Hamamatsu, Japan

[73] Assignee: Hamamatsu Photonics K.K., Hamamatsu, Japan

[21] Appl. No.: 08/779,564

[22] Filed: Jan. 7, 1997

[30] Foreign Application Priority Data

Jan. 8, 1996 [JP] Japan ................. 8-000861

[51] Int. Cl.$^6$ .................................. G01R 31/308
[52] U.S. Cl. ............................. 324/753; 324/96
[58] Field of Search ........................ 324/750, 751, 324/752, 753, 96; 385/133, 146, 147; 362/32

[56] References Cited

U.S. PATENT DOCUMENTS

| | | | |
|---|---|---|---|
| 247,229 | 9/1881 | Wheeler | 362/32 |
| 566,062 | 9/1896 | Takahashi et al. | 324/753 |
| 1,145,022 | 7/1915 | Keuffel | 362/32 |
| 3,994,557 | 11/1976 | Hopkins | 350/33 |
| 4,070,621 | 1/1978 | Bassen et al. | 324/96 |
| 4,517,963 | 5/1985 | Michel | 128/6 |
| 4,891,580 | 1/1990 | Valdmanis | 324/96 |
| 4,911,673 | 3/1990 | Hollowell | 446/219 |
| 5,289,114 | 2/1994 | Nakamura et al. | 324/96 |

FOREIGN PATENT DOCUMENTS

| | | |
|---|---|---|
| 0 430 661 A2 | 6/1991 | European Pat. Off. . |
| 0 515 688 A1 | 12/1992 | European Pat. Off. . |
| 1-286431 | 11/1989 | Japan . |
| 3-131772 | 6/1991 | Japan . |

OTHER PUBLICATIONS

Valdmanis et al, "Subpicosecond Electrooptic Sampling: Principles and Applications" IEEE Journal of Quantum Electronics, vol. QE–22, No. 1, Jan. 1986, pp. 69–78.
Frankel et al, "Optoelectronic Transient Characterization of Ultrafast Devices", IEEE Journal of Quantum Electronics, vol. 28, No. 10, Oct. 1992, pp. 2313–2324.

Primary Examiner—Ernest F. Karlsen
Attorney, Agent, or Firm—Pillsbury Madison & Sutro LLP

[57] ABSTRACT

An electric field measuring apparatus can guide, with a predetermined optical path length, pulse light with a short pulse width output from a laser light source to an object to be measured or an electric field sensor without expansion of the pulse width caused by wavelength dispersion, thereby enabling electric field measurement with a high time resolution. A laser luminous flux incident on an input end of an input optical system is divided by a light dividing section into probe light and pumping light. After being transmitted through a light delaying device, the probe light is guided through an articulated light guiding patt at reflecting mirror type in which a plurality of tubular light guiding sections, each of which has a light guiding path therewithin inducing substantially no wavelength dispersion with a bending point at which reflecting mirror is disposed, are rotatably cascaded to each other such that their light guiding paths coincide with each other by way of joint sections, so as to be supplied to a microscope unit. On the other hand, the pumping light is guided through an articulated probe light guiding path of reflecting mirror type so as to irradiate an object to be measured. Also, a CCD camera is coupled to the exit end of an articulated reflecting mirror type light guiding path, allowing the positioning of the point irradiated with the pumping light.

20 Claims, 6 Drawing Sheets

ELECTRIC FIELD MEASURING APPARATUS

BACKGROUND OF THE INVENTION

1. Field of the Invention

The present invention relates to an electric field measuring apparatus which uses an electro-optic material, whose optical characteristic changes according to an electric field, to measure electric field strength.

2. Related Background Art

Conventionally, as an apparatus for measuring electric field strength, there has been known an electric field measuring apparatus using an electro-optic material (e.g., Japanese Patent Application Laid-Open No. 1-1286431 and IEEE J. of Quantum Electronics, Vol. QE-22, No. 1 (1986) pp. 69–78). FIG. 1 is a configurational view of a conventional electric field measuring apparatus.

This apparatus operates as follows. First, laser light with a short pulse output from a CPM (colliding pulse mode-locked) ring dye laser 40 is divided by a half mirror into a transmitted luminous flux and a reflected luminous flux. The laser light (pumping light) reflected by the half mirror irradiates an object to be measured 10. For example, the object to be measured 10 is a photoconductive optical switch, which generates an electric pulse by photoelectric conversion when irradiated with the pumping light. This electric pulse is propagated through a transmission line, whereby an electric field is applied to an electric field sensor 20 disposed near the transmission line. On the other hand, the laser light (probe light) transmitted through the half mirror is propagated through an optical fiber 42 and then is turned into linearly polarized light by a polarizer 46. This linearly polarized light is reflected by a half mirror 50 and then is converged by a lens 62 so as to be incident on the electric field sensor 20. While traveling to-and-fro through the electric field sensor 20, probe light 30 changes its polarization state according to the electric field being applied to the electric field sensor 20. The probe light output from the electric field sensor 20 is transmitted through a phase compensating plate 54 and then is divided by an analyzer 48 into two luminous fluxes whose polarizing directions are orthogonal to each other. The intensities of the two luminous fluxes are respectively detected by photodetectors 56 and 58 so as to be measured by a lock-in amplifier 60.

For example, such an electric field measuring apparatus is used for measuring the response speed of a photoconductive optical switch shown in FIG. 2. When pumping light 2 is incident on the photoconductive optical switch 10 to which a bias voltage is being applied, an electric pulse 4 is generated by a photoelectric conversion effect. This electric pulse 4 is propagated on a transmission line 12 toward a point where the electric field sensor 20 is disposed nearby by means of a supporting needle 22, thereby applying an electric field to the electric field sensor 20. The electric field measuring apparatus detects this electric field as a change in the polarization state of the probe light 30 during its to-and-fro travel through the electric field sensor 20.

Also, the electric field measuring apparatus is used for evaluating high-speed transistors (IEEE J. of Quantum Electronics, Vol. 28, No. 10 (1992), pp. 2313–2324). When the object to be measured is in a wafer state, it is set to a semiconductor prober, and then a bias electric signal is applied thereto by way of an electric needle so as to evaluate the object to be measured.

SUMMARY OF THE INVENTION

It is an object of the present invention to provide an electric field measuring apparatus which can guide, with a predetermined optical path length, pulse light with a short pulse width output from a laser light source to an object to be measured or an electric field sensor without expanding the pulse width.

The electric field measuring apparatus in accordance with the present invention measures an electric field in the object to be measured, on the basis of a change in the polarization state of probe light irradiating an electro-optic material whose optical characteristic changes according to the electric field. This apparatus comprises a probe light guiding means which comprises: a first number of tubular light guiding sections each of which has a light guiding path therewithin made of a medium having no wavelength dispersion with a bending point at which a reflecting mirror is disposed, and joint sections whose number is smaller than the first number by one and which cascade the first number of tubular light guiding sections at respective connecting points such that optical axes of the light guiding paths coincide with each other while connecting at each connecting point two of the light guiding sections such that they are relatively rotatable around their tube axis; and in which a first luminous flux is incident on an input end so as to be successively guided through the respective light guiding paths of the first number of tubular light guiding sections which are cascaded and then is emitted from an exit end as the probe light and an incident direction of said first luminous flux on said input end and an emitting direction of said probe light from exit end are fixed.

This apparatus operates as follows. The first luminous flux incident on the input end of the probe light guiding means is guided, through the inside of each of the first number of cascaded tubular light guiding sections, on the light guiding path made of a medium having no wavelength dispersion, while being reflected by the reflecting mirror disposed at each bending point, and then is emitted from the exit end. When the rotational position of the rotary part disposed at each connecting point of the first number of cascaded tubular light guiding sections is appropriately determined, the exit end can be set to a desirable position. Accordingly, when the first luminous flux has a pulse form, it is emitted as probe light by way of the light guiding path with a predetermined optical path length while maintaining its pulse width, whereby electric field measurement with a high time resolution can be effected.

The electric field measuring apparatus in accordance with another aspect of the present invention further comprises: (1) a luminous flux dividing means which inputs an incident luminous flux therein, divides thus input luminous flux into two luminous fluxes, and thereby generates first and second luminous fluxes; and (2) a pumping light guiding means which comprises a second number of tubular light guiding sections each of which has a light guiding path therewithin made of a medium having no wavelength dispersion with a bending point at which a reflecting mirror is disposed, and joint sections whose number is smaller than the second number by one and which cascade the second number of tubular light guiding sections at respective connecting points such that optical axes of the light guiding paths coincide with each other while connecting at each connecting point two of the tubular light guiding sections such that they are relatively rotatable around their tube axis; and in which the second luminous flux is incident on an input end so as to be successively guided through the respective light guiding paths of the second number of tubular light guiding sections which are cascaded and then is emitted from an exit end as pumping light for generating an electric field when irradiating a predetermined position of the object to be irradiated.

In this case, like the manner in which the probe light is guided by the probe light guiding means, the pumping light is guided by the pumping light guiding means so as to irradiate the predetermined position of the object to be measured.

In the electric field measuring apparatus in accordance with still another aspect of the present invention, the probe light guiding means deflects the first luminous flux to a right-angle direction at the bending point of each light guiding path of the first number of tubular light guiding sections.

In the electric field measuring apparatus in accordance with a further aspect of the present invention, the pumping light guiding means deflects the second luminous flux to a right-angle direction at the bending point of each light guiding path of the second number of tubular light guiding sections.

In the electric field measuring apparatus in accordance with still another aspect of the present invention, the pumping light guiding means further comprises a condenser lens which is disposed at the exit end and converges the second luminous flux so as to irradiate the predetermined position. In this case, the pumping light is converged by the condenser lens so as to irradiate the predetermined position of the object to be measured, thereby allowing the electric field to be efficiently generated.

In the electric field measuring apparatus in accordance with a further aspect of the present invention, the pumping light guiding means is such that (1) the reflecting mirror disposed at the bending point of the light guiding path of the tubular light guiding section closest to the exit end, of the second number of tubular light guiding sections, is a dichroic mirror which reflects the second luminous flux and transmits therethrough a luminous flux in a predetermined wavelength region other than the wavelength of the second luminous flux, (2) while further comprising an imaging means which inputs therein the luminous flux in the predetermined wavelength region which is incident on the exit end and then transmitted through the dichroic mirror, so as to capture an image of a region including the predetermined position. In this case, when the image captured by the imaging means is monitored, the pumping light can be made to correctly irradiate the predetermined position of the object to be measured.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
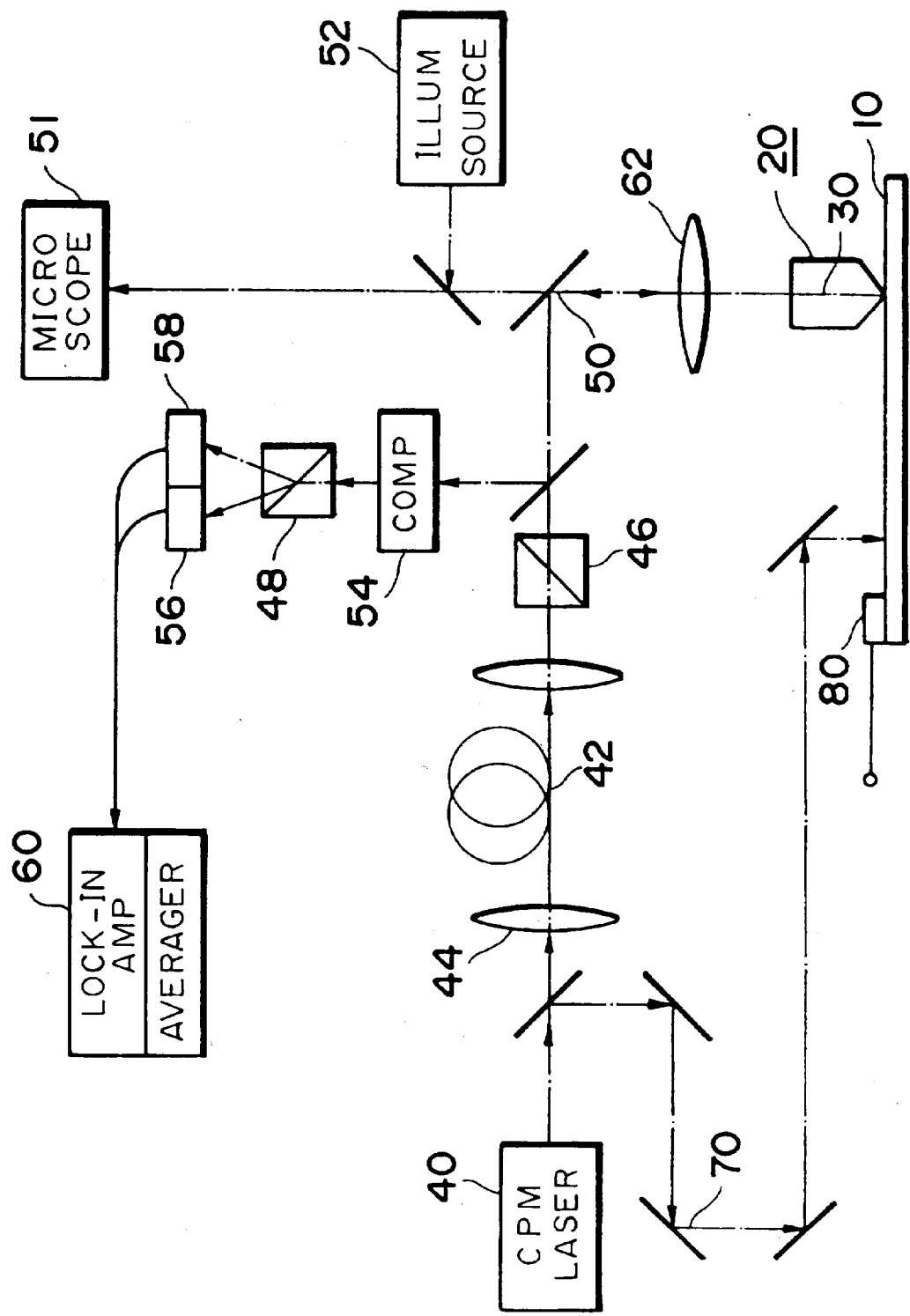
FIG. 1 is a configurational view of a conventional electric field measuring apparatus.
Figure 2:
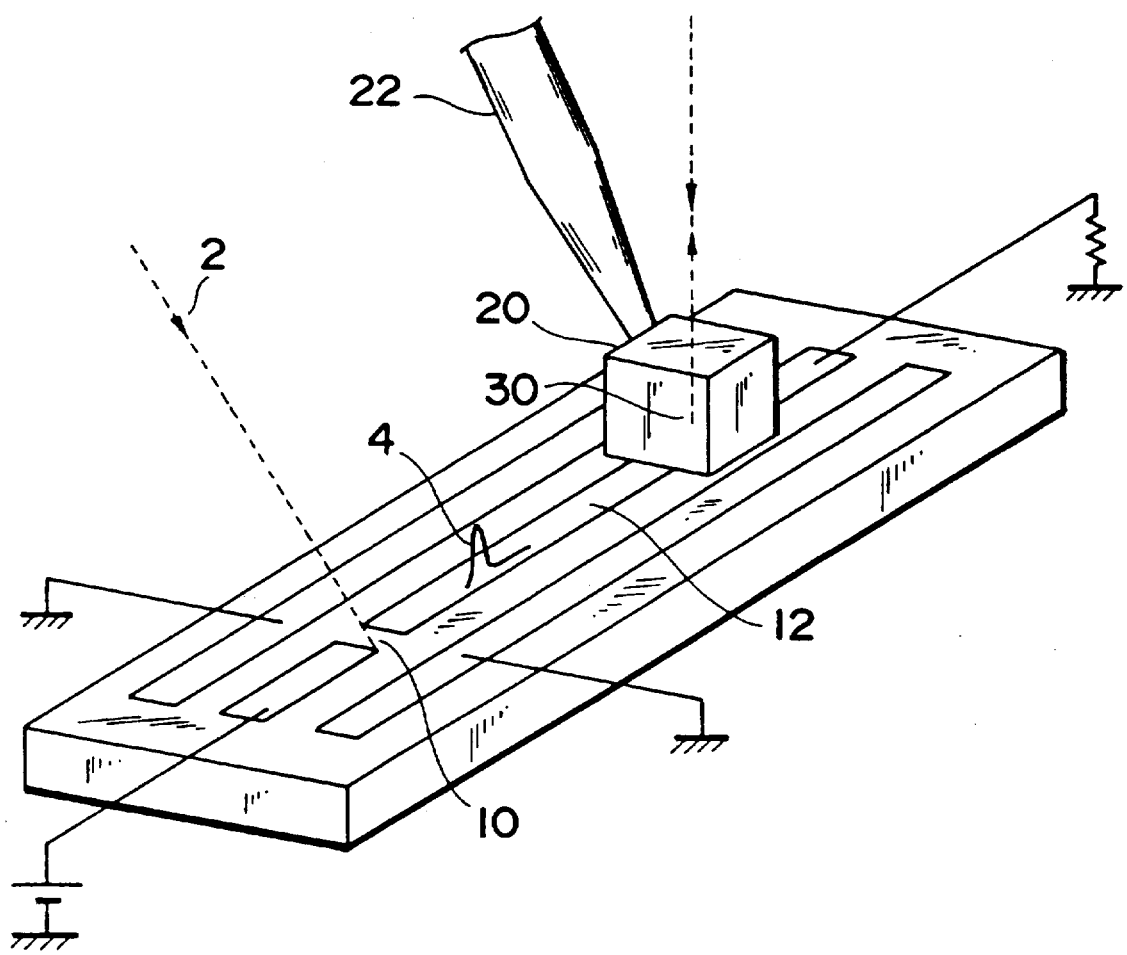
FIG. 2 is an explanatory view for measurement of response speed of a photoconductive optical switch.

The time resolution of measurement in the electric field measuring apparatus shown in FIG. 1 is determined by the pulse width of the pulse light output from its laser light source. Accordingly, a CPM ring dye laser or titanium sapphire laser which can generate pulse light with a pulse width of 100 fs or less is desirably used.

It is necessary for laser light (probe light and pumping light) output from such a laser light source to reach the object to be measured or electric field sensor by way of an optical path having a predetermined optical path length. Since the above-mentioned short pulse laser light source has a large size and is difficult to be united with the electric field measuring apparatus, however, an optical fiber has conventionally been used to guide the laser light from the laser light source to the electric field measuring apparatus as shown in FIG. 1.

Nevertheless, when pulse light having a pulse width of 100 fs or less is guided by an optical fiber, the pulse width may be expanded due to the wavelength dispersion of the optical fiber, thereby deteriorating the time resolution of the electric field measuring apparatus.

In the following, embodiments of the present invention will be explained in detail with reference to the attached drawings. Here, in the explanation of the drawings, constituents identical to each other will be referred to with marks identical to each other, without their overlapping explanations repeated.

Figure 3:
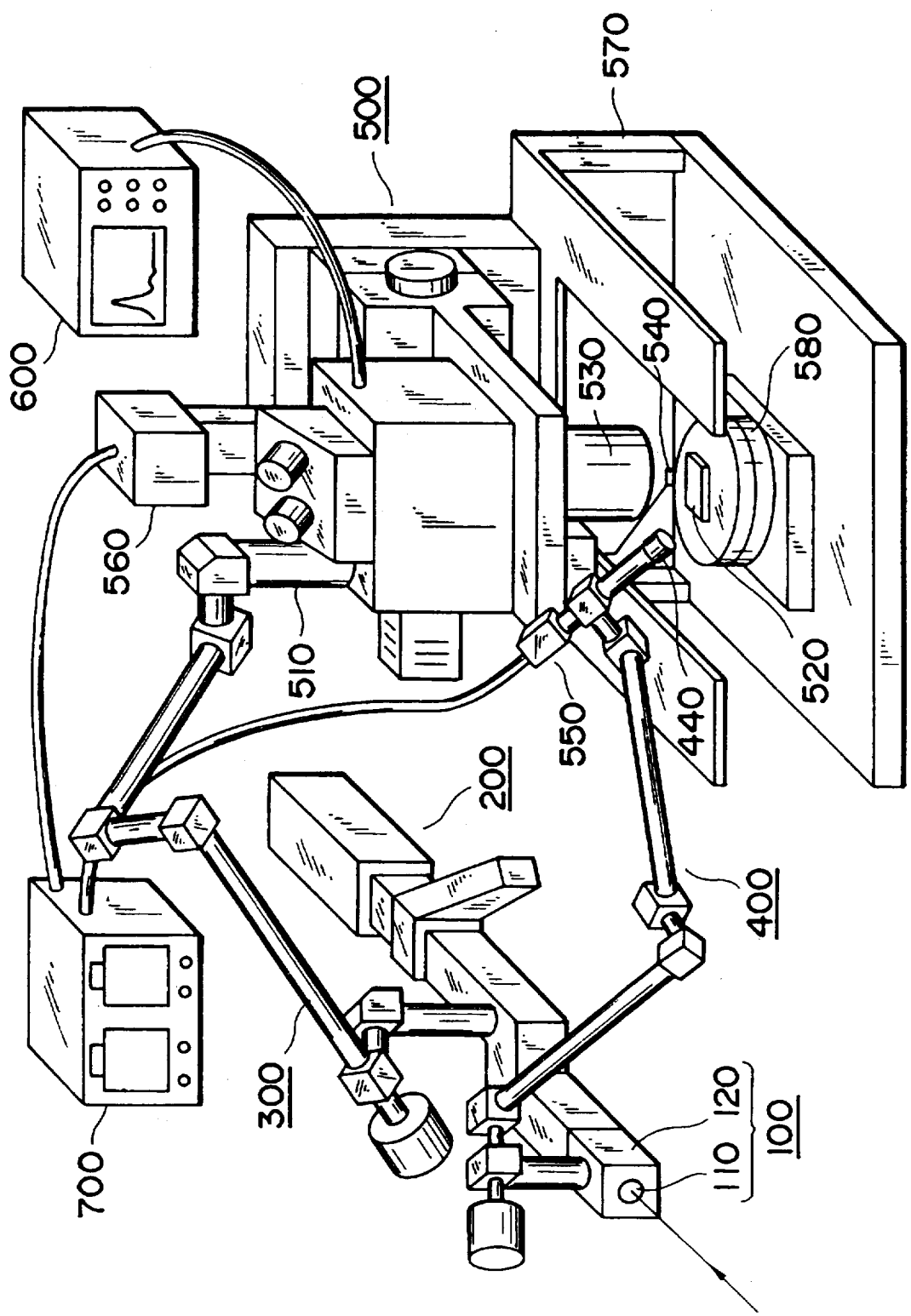
FIG. 3 is a configurational view of an electric field measuring apparatus in accordance with the present invention.

FIG. 3 is a configurational view showing an electric field measuring apparatus in accordance with the present invention. This apparatus comprises: (1) an input optical apparatus 100 which inputs into its input end 110 laser light output from a laser light source and divides the laser light into probe light and pumping light by means of a half mirror disposed within a light dividing section 120; (2) a light delaying device 200 which inputs therein the probe light generated by the light dividing section 120 and generates, periodically in turns on the same optical axis, two luminous fluxes having delays different from each other, one of which can be variably set; (3) an articulated probe light guiding path of reflecting mirror type 300 which guides the probe light composed of the two luminous fluxes output from the light delaying device and makes it incident on an input end 510 of a microscope unit 500; (4) an articulated pumping light guiding path of reflecting mirror type 400 which guides the pumping light generated at the light dividing section 120 and emits it as being converged by a condenser lens 440; (5) the microscope unit 500 which measures, on the basis of a change in the polarization state of the probe light which is input into the input end 510 and then is incident on an electric field sensor 540 by way of an objective lens 530, an electric field generated at an object to be measured 520 which is irradiated with the pumping light emitted from the condenser lens 440; (6) a measured waveform display device 600 which displays the waveform of the electric field strength of the object to be measured which is measured as the change in the polarization state of the probe light; and (7) a CCD camera image display device 700 which displays an image captured by a CCD camera 550 observing the position irradiated with the pumping light on the object to be measured 520 and an image captured by a CCD camera 560 observing the position at which the electric field sensor 540 is disposed.

The input optical system 100 which inputs into the input end 110 the laser light output from the laser light source (not depicted), together with the laser light source, is fixedly disposed on an optical surface plate. A part of the incident laser light is transmitted through a half mirror disposed within the light dividing section 120 to become the probe light, while the remainder is reflected thereby to become the pumping light.

The pumping light reflected by the half mirror of the light dividing section 120 is guided through the articulated pumping light guiding path of reflecting mirror type 400 (which will be explained later in detail) and then is converged by the condenser lens 440 so as to irradiate a predetermined position of the object to be measured 520. This object 520 is united with the microscope unit 500 by means of a probe station 570 and is mounted on a sample table 580 which is movable by an XYZ stage.

In order to monitor which position on the object 520 is irradiated with the pumping light output from the condenser lens 440, the CCD camera 550 is disposed. When the focal position of this CCD camera 550 is made to coincide with the converging position of the condenser lens 440 beforehand while a dichroic mirror which reflects the laser light and transmits therethrough a luminous flux in a predetermined wavelength region other than the wavelength of this laser light is disposed between the CCD camera 550 and the condenser lens 440, on the basis of the monitor image displayed on the CCD camera image display device 700, the pumping light can be made to correctly irradiate the predetermined position on the object 520. The detail of this operation will be explained later.

On the other hand, the probe light transmitted through the half mirror of the light dividing section 120 is input into the light delaying device 200. Based on the incident probe light, the light delaying device 200 outputs probe light in which two luminous fluxes having delays different from each other on the same optical axis periodically alternate. Further, the light delaying device 200 can change the amount of delay of one of the two luminous fluxes. The detail thereof will be explained later.

The probe light output from the light delaying device 200 is guided through the articulated probe light guiding path of reflecting mirror type 300 (which will be explained later in detail) to reach the input end 510 of the microscope unit 500. Subsequently, the probe light acquires a predetermined polarization state by means of a polarizer (not depicted) or the like in the microscope unit 500 and then is converged by the objective lens 530 so as to be incident on the electric field sensor 540.

This electric field sensor 540 is disposed at a predetermined position near the object to be measured 520, on the basis of the monitor images of the object 520 and electric field sensor 540 captured by the CCD camera 560 and displayed on the CCD camera image display device 700. Namely, the electric field sensor 540 is disposed within the electric field of an electric pulse which is generated by photoelectric conversion as the pumping light irradiates the object 520.

The probe light incident on the electric field sensor 540 is reflected by a reflecting surface formed on the bottom surface of the electric field sensor 540 and advances toward the objective lens 530 again. Thus, as the probe light travels to-and-fro through the electric field sensor 540, the polarization state of the probe light changes in response to the electric field strength.

The probe light whose polarization state has changed in response to the electric field strength passes through the objective lens 530 in a direction opposite to that when previously incident thereon and, by way of an analyzer (not depicted) or the like, is photoelectrically converted by a photodetector (not depicted) into an output electric signal corresponding to the amount of change in polarization state. This electric signal is output from the microscope unit 500 so as to be input into the measured waveform display device 600. Also, a signal corresponding to the difference in delay between the two luminous fluxes formed at the light delaying device 200 is input into the measured waveform display device 600 as a sweep signal. Thus, the measured waveform display device 600 shows the waveform of the electric pulse generated when the pumping light irradiates the object 520.

Figure 4:
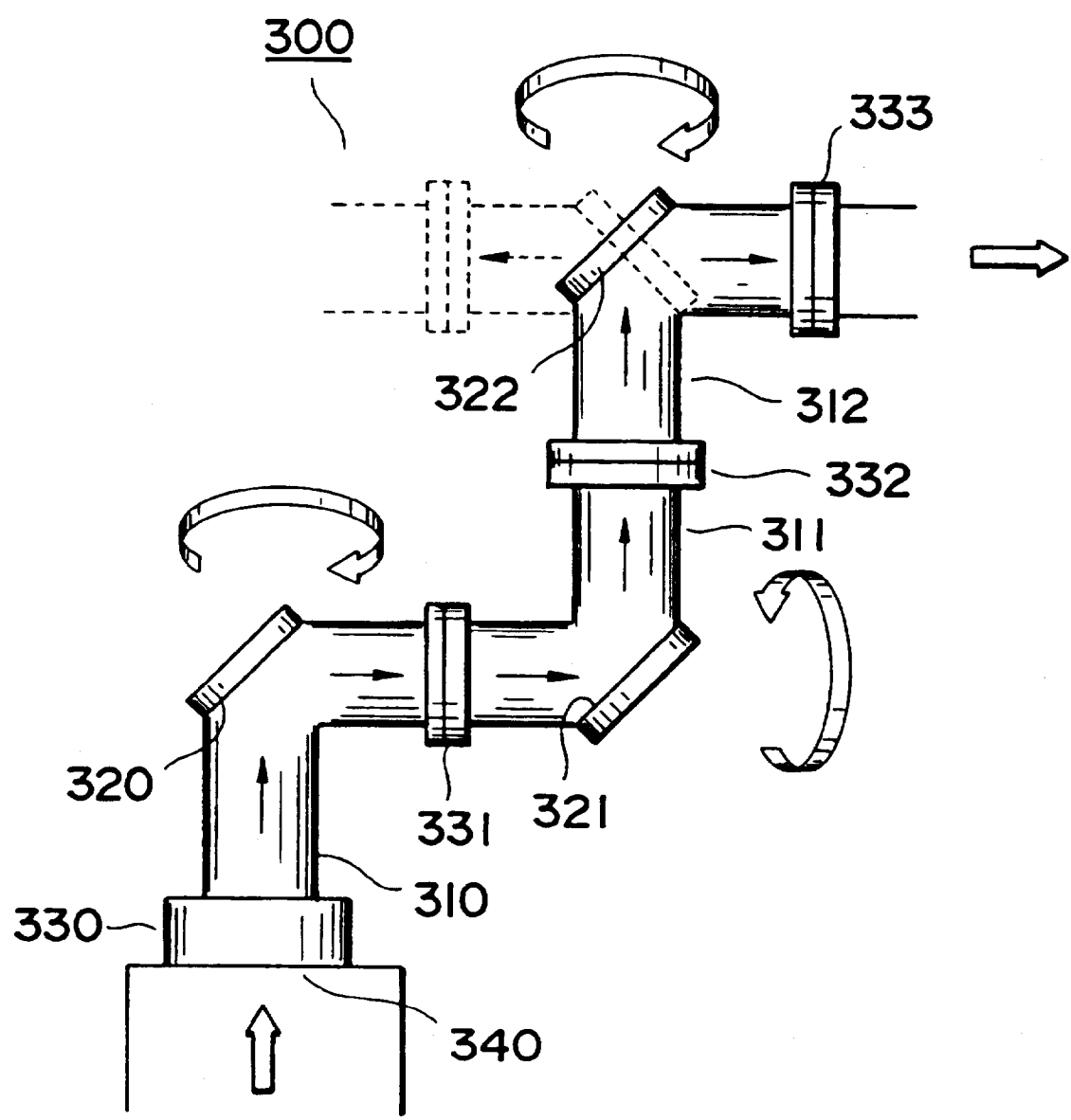
FIG. 4 is an explanatory view for an articulated reflecting mirror type light guiding path used in the electric field measuring apparatus in accordance with the present invention.

In the following, the articulated light guiding paths of reflecting mirror type will be explained in detail. Here, the main parts of the articulated reflecting mirror type probe light guiding path and those of the articulated pumping light guiding path of reflecting mirror type are similar to each other in terms of configuration, though their input and output ends may have different structures according to necessity. FIG. 4 is an explanatory view for an articulated light guiding path of reflecting mirror type used in the electric field measuring apparatus in accordance with the present invention.

As depicted, the articulated reflecting mirror type light guiding path 300 comprises tubular light guiding sections 310, 311, 312, . . . , each of which has therewithin a light guiding path made of a medium (e.g., gas such as air and inert gas or, ideally, vacuum atmosphere) whose wavelength dispersion determined by the wavelength of the luminous flux to be guided, optical path length, and refractive index is null or very small and which are cascaded to each other by way of joint sections 330, 331, 332, 333, . . . . The tubular light guiding sections 310, 311, 312, . . . respectively have bending points of the light guiding path, where reflecting mirrors 320, 321, 322, . . . are respectively disposed. The deflecting direction at each of the reflecting mirrors 320, 321, 322, . . . is 90 degrees. As each of the joint sections 330, 331, 332, 333, . . . rotates, two tubular light guiding sections connected to each other by the joint section relatively rotate around their tube axis. For example, when the joint section 332 rotates, the tubular light guiding section 312 initially oriented to the direction indicated by continuous lines with respect to the tubular light guiding section 311 can be oriented to the direction indicated by broken lines, whereby the light guiding path of a luminous flux can be changed.

The luminous flux incident on an input end 340 of this articulated probe light guiding path of reflecting mirror type 300 initially passes through the joint section 330 so as to be propagated through the light guiding path within the tubular light guiding section 310 and then is reflected by the reflecting mirror 320 disposed at the bending point in the middle of the light guiding path, thereby reaching the joint section 331. Subsequently, the luminous flux is propagated through the light guiding path within the tubular light guiding section 311 and then is reflected by the reflecting mirror 321 disposed at the bending point in the middle of the light guiding path, thereby reaching the joint section 332. Further, the luminous flux is propagated through the light guiding path within the tubular light guiding section 312 and then is reflected by the reflecting mirror 322 disposed at the bending point in the middle of the light guiding path, thereby reaching the joint section 333. Thus, the luminous flux incident on the input end 340 is successively guided through the light guiding paths within the tubular light guiding sections 310, 311, 312, . . . , reaches an exit end which is disposed at a predetermined position and direction according to the rotational positions of the joint sections 330, 331, 332, 333, . . . , and is emitted therefrom. The incident direction of light flux into the articulated probe light guiding path of reflecting mirror type and the emitting direction of the probe light from the articulated reflecting mirror type probe light guiding path are fixed and preferably, the two directions are in parallel with each other or perpendicular to each other.

The characteristics of such an articulated probe light guiding path of reflecting mirror type are as follows. The first characteristic lies in that the light guiding path from the input end 340 to the exit end is constituted by the air within the tubular light guiding sections 310, 311, 312, . . . having a very small wavelength dispersion. Accordingly, the pulse-shaped luminous flux with a short pulse width incident on the input end 340 is emitted from the exit end while maintaining this pulse width, thereby enabling electric field measurement with a high time resolution. It is also significant for the luminous flux to be guided through the tubular light guiding sections 310, 311, 312, . . . in terms of safety. Further, its handling is easy without risk of the luminous flux being blocked due to inadvertence of an operator.

The second characteristic lies in that the optical path length from the input end to the outlet end is constant no matter what rotational state the joint sections are in. Accordingly, when an articulated probe light guiding path of reflecting mirror type having a predetermined optical path length is used for supplying laser light (pumping light and probe light) output from the laser light source to the microscope unit 500, regardless of the position on the object to be measured 520 at which the electric field strength is measured by the electric field sensor 540, the timing for the probe light irradiation with respect to the pumping light irradiation is not mistaken. Without taking this timing into consideration, the measuring operator can efficiently perform measurement and inspection.

The third characteristic lies in that a linearly polarized luminous flux incident on the input end is output from the exit end while maintaining its state of linear polarization no matter what rotational state the joint sections are in (the reason of which will be explained later in detail). Accordingly, in the electric field measuring apparatus for measuring the electric field strength as a change in polarization state of the probe light, while it is necessary for the polarization state of the probe light incident on the electric field sensor 540 to be adjusted within the microscope unit 500 by means of a polarizer or the like, the probe light can be efficiently utilized when the direction of the optic axis of the polarizer is set according to the direction of linear polarization of the probe light incident on the input end of the articulated light guiding path of reflecting mirror type.

Figure 5:
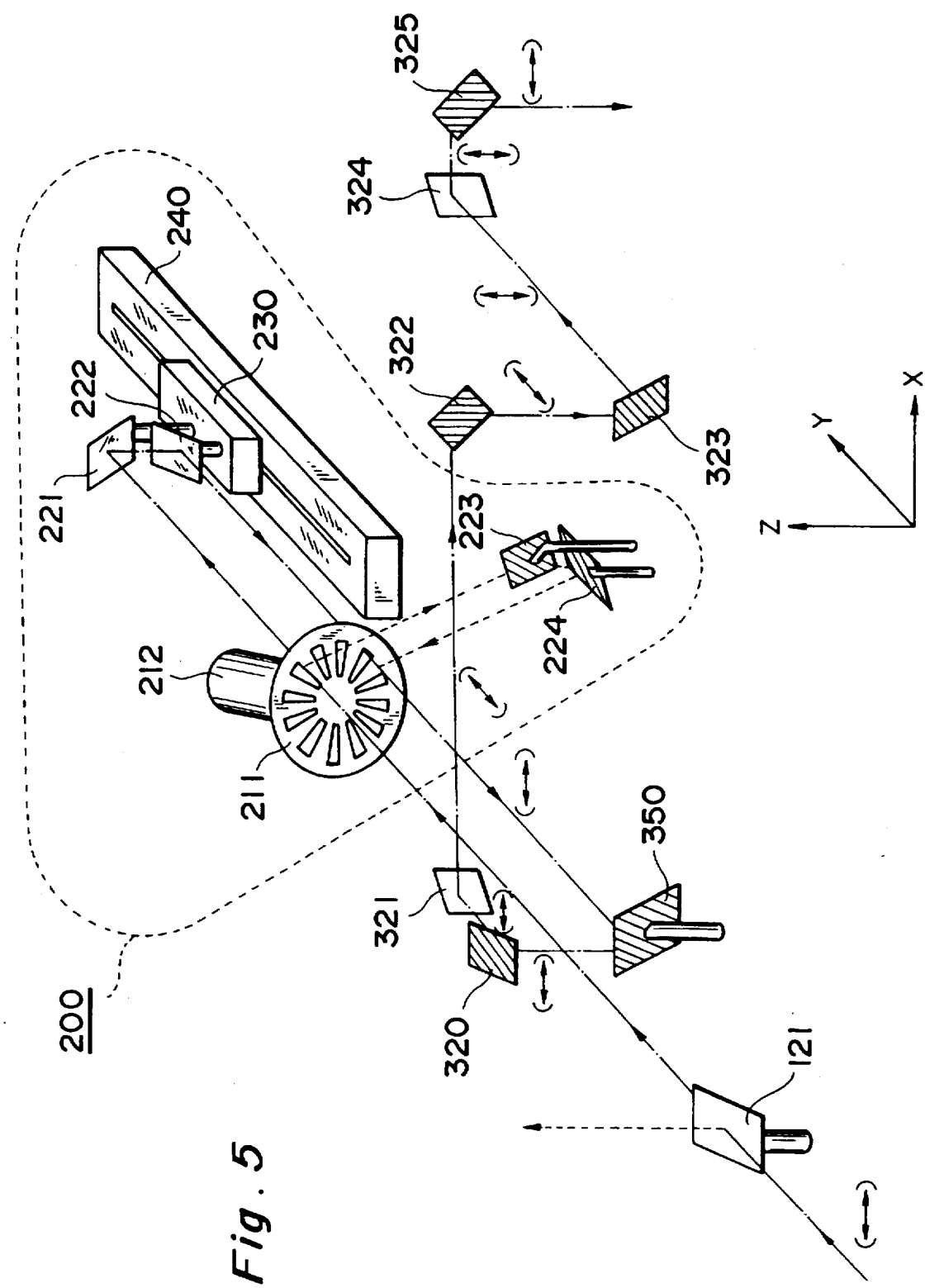
FIG. 5 is an explanatory view for showing how probe light is guided in a light delaying device and an articulated reflecting mirror type probe light guiding path which are used in the electric field measuring apparatus in accordance with the present invention.

In the following, the light delaying device 200 will be explained. FIG. 5 is an explanatory view showing how the probe light is guided in the light delaying device and the articulated reflecting mirror type probe light guiding path which are used in the electric field measuring apparatus in accordance with the present invention. In this drawing, the guiding path of the probe light is depicted in a simplified form in order to facilitate explanation.

In the light delaying device 200, a rotary plate 211 having reflecting sections and transmitting sections which are formed periodically in turns on a circumference around a center point is disposed in parallel to Z axis while having a predetermined angle (e.g., 45 degrees) with respect to the incident probe light and rotates at a constant speed as being driven by a motor 212, thereby generating transmitted and reflected luminous fluxes periodically in turns based on the incident probe light. As the rotary plate 211 rotates, a reflected luminous flux is generated when the probe light is incident on the reflecting section of the rotary plate 211. This reflected luminous flux is reflected by reflecting mirrors 223 and 224 so as to be reflected by the reflecting section of the rotary plate 211 again and then emitted from the light delaying device 200. On the other hand, when the probe light is incident on the transmitting section of the rotary plate 211, a transmitted luminous flux is generated. This transmitted luminous flux is reflected by reflecting mirrors 221 and 222 so as to be transmitted through the transmitting section of the rotary plate 211 again and then emitted from the light delaying device 200. The positions and azimuths of the four reflecting mirrors 221 to 224 are determined such that two luminous fluxes having delays different from each other, which are emitted from the light delaying device 200 and constitute the probe light, advance on the same optical axis and such that the emitted probe light advances in a direction opposite to the incident probe light in parallel to the optical axis of the latter. Also, the reflecting mirrors 221 and 222 are fixedly disposed on a movable stage 230 which is movable on a fixed table 240 in the optical-axis direction of the incident probe light.

When probe light is incident on such a light delaying device 200, it is emitted as probe light in which two luminous fluxes having delays different from each other periodically alternate, while the amount of delay in one of the luminous fluxes can be changed. The probe light output from this light delaying device 200 is guided to the microscope unit 500 by way of the articulated probe light guiding path of reflecting mirror type 300 and then is converged by the objective lens 530 so as to be incident on the electric field sensor 540. The probe light incident on the electric field sensor 540 changes its polarization state in response to the strength of an electric field applied to the electric field sensor 540 and then is transmitted through the objective lens 530 again, whereby the intensity of its polarization component in a predetermined direction is detected by an analyzer and a photodetector.

The detected signal is measured by a lock-in amplifier or the like in synchronization with the timing at which the two luminous fluxes are alternately formed in the light delaying device 200. Thus synchronously measured signal corresponds to the difference in delay time between the two luminous fluxes, i.e., the position of the movable stage 230. Accordingly, while the movable stage 230 is successively moved, the waveform of the electric pulse generated when the pumping light irradiates the object to be measured 520 can be measured.

Such a system in which measurement is made in synchronization with the timing for generating two luminous fluxes forming the probe light is equivalent to a lighting timing control system (e.g., Japanese Patent Application Laid-Open No. 3-131772) in an electric field measuring apparatus using a semiconductor laser as its light source.

In the following, the polarization state of a luminous flux guided through an articulated light guiding path of reflecting mirror type will be explained. As shown in FIG. 5, an XYZ orthogonal coordinate system is set in a space extending from the laser light source (not depicted) to the microscope unit 500 by way of the light delaying device 200 and the articulated probe light guiding path of reflecting mirror type 300. Then, it is assumed that the laser light output from the laser light source is light linearly polarized in X direction and output in +Y direction. Also, it is assumed that the rotary plate 211 of the light delaying device 200 generating transmitted light and reflected light periodically in turns with respect to the incident light is in parallel to Z axis. Further, it is assumed that the articulated probe light guiding path of reflecting mirror type 300 inputs therein laser light which is reflected in +Z direction by a reflecting mirror 350, deflects and reflects in a right-angle direction the laser light incident on each of reflecting mirrors 320 to 325, and reflects and emits the laser light in -Z direction at a reflecting mirror 325 in the last stage, while the optical axis during the guiding of light is in parallel to any of X, Y, and Z axes.

The probe light transmitted through a half mirror 121 of the light dividing section 120 maintains its state of linear polarization in X direction. This probe light maintains its state of linear polarization in X direction until it reaches the reflecting mirror 350 either after passing through the transmitting section of the rotary plate 211 so as to be reflected in -Z direction by the reflecting mirror 221, reflected in -Y direction by the reflecting mirror 222, and then transmitted through the transmitting section of the rotary plate 211 again or after being reflected in a predetermined direction on XY plane by the reflecting section of the rotary plate 211 so as to be reflected in -Z direction by the reflecting mirror 223, reflected in a predetermined direction on XY plane by the reflecting mirror 224, and then reflected by the reflecting section of the rotary plate 211 again.

Subsequently, the probe light which is reflected in +Z direction by the reflecting mirror 350 so as to be incident on the articulated probe light guiding path of reflecting mirror type 300 is reflected in +Y direction by the reflecting mirror 320 and maintains its state of linear polarization in X direction until it reaches the reflecting mirror 321. The probe light reflected in +X direction by the reflecting mirror 321 is reflected in -Z direction by the reflecting mirror 322 and is light linearly polarized in Y direction until it reaches the reflecting mirror 323. The probe light reflected in +Y direction by the reflecting mirror 323 is reflected in +X direction by the reflecting mirror 324 and is light linearly polarized in Z direction until it reaches the reflecting mirror 325. Then, the probe light reflected in -Z direction by the reflecting mirror 325 is emitted therefrom as light linearly polarized in X direction. FHP 96-02

The optical path of the articulated probe light guiding path of reflecting mirror type 300 explained in the foregoing is only an example thereof. Also, in order to simplify the explanation, the optical axis of the articulated probe light guiding path of reflecting mirror type 300 is assumed to be in parallel to any of X, Y, and Z axes. Nevertheless, regardless of the rotational position of each joint section, i.e., optical path, the probe light incident on the input end of the articulated probe light guiding path of reflecting mirror type 300 in +Z direction as light linearly polarized in X direction is emitted as light linearly polarized in X direction when emitted in -Z direction.

In the above embodiments, the tubular type light guiding sections are explained, but other type light guide sections such as a plate-like or rod-type may be used in the apparatus also.

Also, since six pieces of reflecting mirrors 320 to 325 are disposed on the optical path of the articulated probe light guiding path of reflecting mirror type 300 explained in the foregoing with reference to FIG. 5, the probe light is output from the exit end while being in the above-mentioned state of linear polarization in X direction. When the number of the reflecting mirrors differs therefrom, however, the output probe light has a different direction of linear polarization. For example, in the case of an articulated light guiding path of reflecting mirror type having five pieces of reflecting mirrors, when probe light similar to that of FIG. 5 is incident on the input end of the articulated probe light guiding path of reflecting mirror type, the probe light emitted in -Z direction after being reflected by the reflecting mirror in the last stage becomes light linearly polarized in Y direction. In such a case, the direction of the optic axis of the polarizer in the microscope unit 500 may be rotated by an angle of 90 degrees with respect to the optic axis of the polarizer in the case of FIG. 5 or the polarizing direction of the probe light incident on the input end of the articulated probe light guiding path of reflecting mirror type may be set to Z direction.

Figure 6:
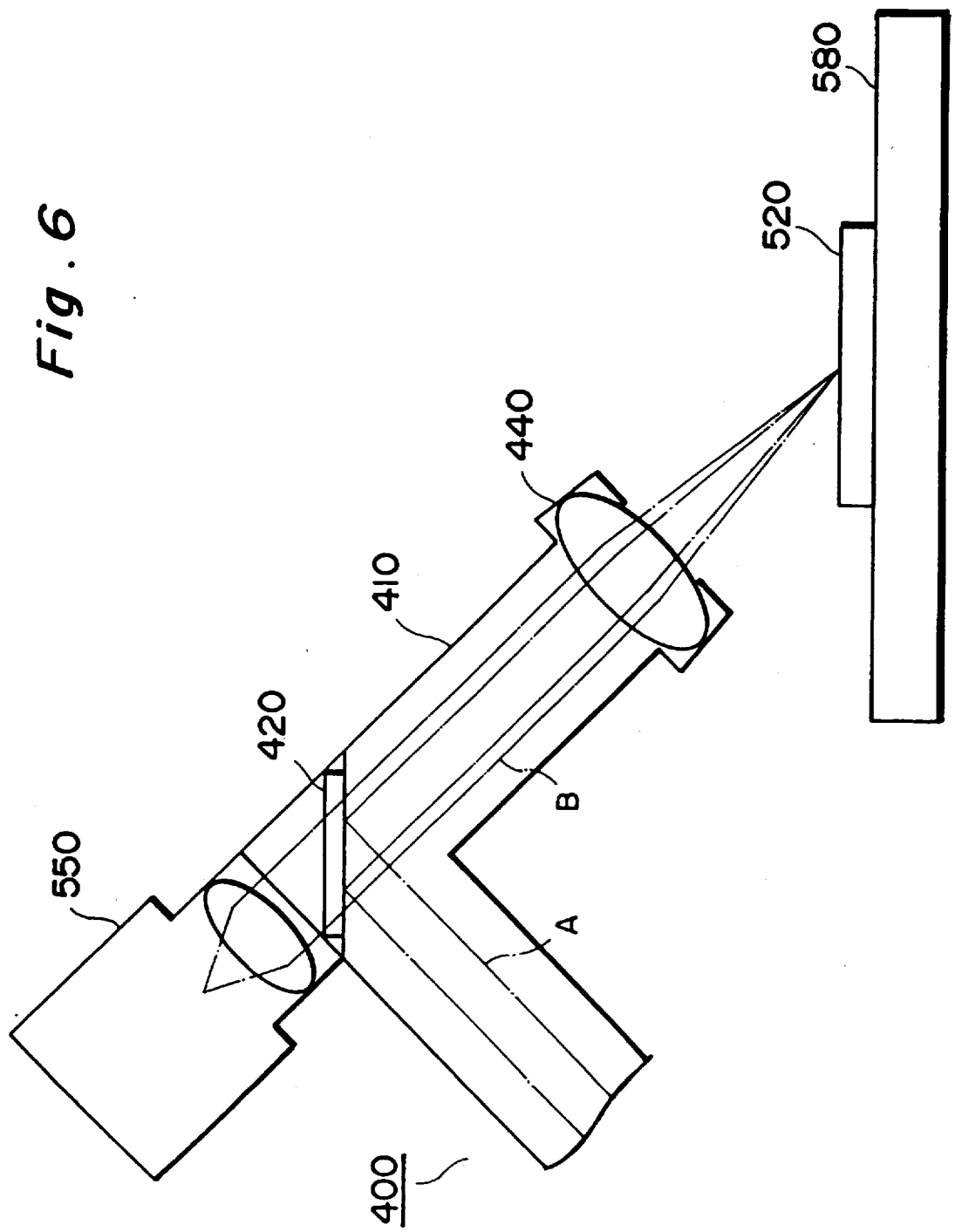
FIG. 6 is a cross-sectional view for explaining the disposition of a CCD camera in the exit end of an articulated pumping light guiding path of reflecting mirror type used in the electric field measuring apparatus in accordance with the present invention.

In the following, the positioning of the irradiating point of the pumping light output from the articulated pumping light guiding path of reflecting mirror type will be explained. FIG. 6 is a cross-sectional view explaining the disposition of a CCD camera in the exit end of the articulated pumping light guiding path of reflecting mirror type used in the electric field measuring apparatus in accordance with the present invention.

Disposed at the bending point of a tubular light guiding section 410 at the last stage of the articulated pumping light guiding path of reflecting mirror type 400 is a dichroic mirror 420 which reflects pumping light A and transmits therethrough a luminous flux B in a predetermined wavelength region other than the wavelength of the pumping light A. After being reflected by this dichroic mirror 420, the pumping light A is converged by the condenser lens 440 disposed at the exit end, so as to irradiate a predetermined position of the object to be measured 520. On the other hand, the luminous flux B which is reflected or scattered by the object 520 and directed toward the condenser lens 440 reaches the imaging surface of the CCD camera 550 by way of the condenser lens 440, dichroic mirror 420, and lens system of the CCD camera 550, whereby the image of the surface of the object 520 is captured and displayed on the CCD camera image display device 700 as shown in FIG. 3.

Further, the converging position of the pumping light A by the condenser lens 440 and the focal position of the CCD camera 550 are made to coincide with each other beforehand, and it is confirmed beforehand which position in the monitor image displayed on the CCD camera image display device 700 corresponds to the converging position of the pumping light A by the condenser lens 440. Then, when the position and azimuth of the exit end of the articulated pumping light guiding path of reflecting mirror type 400 are adjusted such that the position on the object 520 to be irradiated with the pumping light A is displayed as being in focus with a predetermined position in the monitor image displayed on the CCD camera image display device 700, the pumping light A can irradiate the predetermined position on the object 520 as being correctly converged thereon.

Without being restricted to the foregoing embodiments, the present invention can be modified in various manners. For example, without irradiating the object to be measured with pumping light, an electric pulse generated by other methods may be measured. In this case, the light dividing section 120 and the articulated reflecting mirror type pumping light guiding path 400 are unnecessary.

Also, the CCD camera 550 for capturing the image of the position irradiated with the pumping light may not have a configuration shown in FIGS. 3 and 6. For example, it may be disposed outside of the tubular light guiding section 410 so as to be in focus with the position irradiated with the pumping light.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 000861/1996 filed on Jan. 8, 1996 is hereby incorporated by reference.

What is claimed is:

1. An electric field measuring apparatus for measuring an electric field based on a change in polarization state of probe light irradiating a material whose optical characteristic changes according to the electric field, said apparatus comprising:
    a) a probe light guiding means which comprises
        a1) a first number of light guiding sections, each of which has a light guiding path therewithin inducing substantially no wavelength dispersion and a bending point at which a reflecting mirror is disposed, and
        a2) joint sections, whose number is smaller than said first number by one and which cascade said first number of light guiding sections such that
            a2i) at each one of said joint sections two of said first number of light guiding sections are connected to be relatively rotatable around an axis of said one of said joint sections and in such manner that optical axes of said light guiding paths of said two of said first number of light guiding sections coincide;
        a3) in which a first luminous flux is incident on an input end, is successively guided through said light guiding paths of said first number of light guiding sections which are cascaded, and then is emitted from an exit end as the probe light, and
    b) an electric field sensor whose optical characteristic changes according to an electric field to be measured,
    c) wherein said electric field sensor receives the probe light at least indirectly from said probe light guiding means, and
    d) wherein an incident direction of said first luminous flux on said input end of said probe light guiding means, and an emitting direction of the probe light from an exit end of said probe light guiding means, are fixed with respect to each other.

2. An electric field measuring apparatus according to claim 1, further comprising:
    e) a luminous flux dividing means which receives an incident luminous flux and divides the incident luminous flux into said first luminous flux and a second luminous flux; and
    f) a pumping light guiding means which comprises
        f1) a second number of light guiding sections, each of which has a light guiding path therewithin inducing substantially no wavelength dispersion and a bending point at which a reflecting mirror is disposed, and
        f2) joint sections, whose number is smaller than said second number by one and which cascade said second number of light guiding sections such that
            f2i) at each one of said joint sections two of said second number of light guiding sections are connected to be relatively rotatable around an axis of said one of said joint sections and in such manner that optical axes of said light guiding paths of said two of said second number of light guiding sections coincide;
        f3) in which said second luminous flux is incident on an input end, is successively guided through said light guiding paths of said second number of light guiding sections which are cascaded, and then is emitted from an exit end as pumping light for generating an electric field by irradiating a predetermined position of an object under test.

3. An electric field measuring apparatus according to claim 1, wherein said probe light guiding means deflects said first luminous flux to a right-angle direction at the bending point of each light guiding path of said first number of tubular light guiding sections.

4. An electric field measuring apparatus according to claim 2, wherein said pumping light guiding means deflects said second luminous flux to a right-angle direction at the bending point of each light guiding path of said second number of tubular light guiding section.

5. An electric field measuring apparatus according to claim 2, wherein said pumping light guiding means further comprises a condenser lens which is disposed at said exit end and converges said second luminous flux so as to irradiate said predetermined position.

6. An electric field measuring apparatus according to claim 2, wherein said pumping light guiding means is such that the reflecting mirror disposed at the bending point of the light guiding path of the tubular light guiding section closest to said exit end, of said second number of tubular light guiding sections, is a dichroic mirror which reflects said second luminous flux and transmits therethrough a luminous flux in a predetermined wavelength region other than the wavelength of said second luminous flux; and further comprises an imaging means which inputs therein the luminous flux in said predetermined wavelength region which is incident on said exit end and then transmitted through said dichroic mirror, so as to capture an image of a region including said predetermined position.

7. An electric field measuring apparatus according to claim 1, wherein said incident direction is substantially parallel with said emitting direction.

8. An electric field measuring apparatus according to claim 1, wherein said incident direction is perpendicular to said emitting direction.

9. An electric field measuring apparatus according to claim 1, wherein said light guide sections have tubular shapes.

10. An electric field measuring apparatus according to claim 2, wherein said light guide sections have tubular shapes.

11. An electric field measuring apparatus according to claim 1, wherein a polarization state of the probe light at the exit end of said probe light guiding means remains constant without regard to the relative rotations of said first number of light guiding sections.

12. An electric field measuring apparatus according to claim 2, wherein a polarization state of the probe light at the exit end of said probe light guiding means remains constant without regard to the relative rotations of said first number of light guiding sections.

13. An electric field measuring apparatus according to claim 1, wherein the light guiding paths within said first number of light guiding sections contain one of a vacuum or a medium other than air.

14. An electric field measuring apparatus according to claim 2, wherein the light guiding paths within said first number of light guiding sections contain one of a vacuum or a medium other than air.

15. An electric field measuring apparatus according to claim 5, wherein a polarization state of the probe light at the exit end of said probe light guiding means remains constant without regard to the relative rotations of said first number of light guiding sections.

16. An electric field measuring apparatus according to claim 6, wherein a polarization state of the probe light at the exit end of said probe light guiding means remains constant without regard to the relative rotations of said first number of light guiding sections.

17. An electric field measuring apparatus according to claim 5, wherein the light guiding paths within said first number of light guiding sections contain one of a vacuum or a medium other than air.

18. An electric field measuring apparatus according to claim 6, wherein the light guiding paths within said first number of light guiding sections contain one of a vacuum or a medium other than air.

19. An electric field measuring apparatus according to claim 15, wherein the light guiding paths within said first number of light guiding sections contain one of a vacuum or a medium other than air.

20. An electric field measuring apparatus according to claim 16, wherein the light guiding paths within said first number of light guiding sections contain one of a vacuum or a medium other than air.

* * * * *